United States Patent [19]

Ferrando et al.

[11] Patent Number: 5,261,151
[45] Date of Patent: Nov. 16, 1993

[54] MULTIFILAMENTARY SUPERCONDUCTING CABLE AND A METHOD OF MANUFACTURING IT

[75] Inventors: William A. Ferrando, Arlington; Amarnath P. Divecha, Falls Church, both of Va.; James Kerr, Bethesda, Md.

[73] Assignee: The United States of America as represented by the Secretary of the Navy, Washington, D.C.

[21] Appl. No.: 914,669

[22] Filed: Jul. 17, 1992

[51] Int. Cl.$^5$ ............................................. H01L 39/24
[52] U.S. Cl. .................................... 29/599; 29/458; 29/527.2; 427/62; 427/118; 427/125; 427/229
[58] Field of Search ............... 29/599, 458, 527.1, 29/527.2; 427/62, 63, 118, 123, 125, 229, 380, 431, 434.6

[56] References Cited

U.S. PATENT DOCUMENTS

| | | | |
|---|---|---|---|
| 4,958,763 | 9/1990 | Divecha et al. | 228/193 |
| 4,978,054 | 12/1990 | Ferrando et al. | 228/194 |
| 4,988,673 | 1/1991 | Ferrando | 505/1 |
| 5,045,349 | 9/1991 | Ferrando | 427/113 |
| 5,051,307 | 9/1991 | Divecha et al. | 428/408 |
| 5,091,362 | 2/1992 | Ferrando | 505/1 |
| 5,100,049 | 3/1992 | Divecha et al. | 228/198 |
| 5,120,575 | 6/1992 | Ferrando et al. | 427/229 |

*Primary Examiner*—Joseph M. Gorski
*Attorney, Agent, or Firm*—John D. Lewis; Roger D. Johnson

[57] ABSTRACT

A Nb-Ti or Nb-Zr low temperature superconducting (LTS) wire is coat with molten $AgNO_3$ which is then decomposed to form a uniform silver metal (Ag) coating on the LTS wire. A uniform coating of molten Al or Al alloy is formed on the Ag coated LTS wire and then solidified. A bundle of the coated LTS wires is inserted into an Al or Al alloy tube and cold worked to form a multifilamentary LTS cable comprising the Ag coated LTS wires each surrounded by an Al or Al alloy matrix.

17 Claims, No Drawings

MULTIFILAMENTARY SUPERCONDUCTING CABLE AND A METHOD OF MANUFACTURING IT

BACKGROUND OF THE INVENTION

This application relates to superconductors and more particularly to low temperature superconductors.

Multifilamentary Low Temperature Superconduct or (LTS) cables are normally produced by drilling bronze cylinders, inserting rods of superconductor precursor wire, drawing down to fine diameter and heat treating to obtain the superconducting properties. Unfortunately, a similar procedure cannot be used in the case of aluminum because of its tenacious surface oxide layer. For example, pure aluminum ribbon may be wrapped on Nb-Ti wire and sections of same may be inserted into a tube and swaged. There remains, however, present on the aluminum surface its oxide layer, which is very difficult to dislodge. Thus when individual strands are consolidated in a tube, the oxide layers remain in between inhibiting strong bonding. This, in turn, cause poor thermal and electrical characteristics of the cable.

Another fabrication problem encountered in drawing or swaging multifilamentary wires within a soft metal surrounding matrix is "sausaging." This is evidenced as a pinching off of individual strands as the composite wire is swaged. Swaging aluminum Ion Vapor Deposited (IVD) Nb-Ti wire strands has shown that sausaging largely can be eliminated if the soft aluminum layer on the strands is thin and uniform. A working criterion for this is that the aluminum coating be very much less than the wire diameter The thin aluminum layer is very difficult to obtain by wrapping Harder aluminum alloys must be used, which may not produce as acceptable a superconductor cable.

Finally, if the Nb-Ti strands are simply dipped into molten aluminum, a ring of reaction products forms in the outer portion of the wire/aluminum interface. This would be detrimental to the final quality of multistrand cable made from this wire as evidenced in reduced critical current ($J_c$) and poor thermal stability.

SUMMARY OF THE INVENTION

According an object of this invention is to provide new multifilamentary low temperature superconductor cables.

Another object of this invention is to provide a new method of producing multifilamentary low temperature superconductor cables.

A further object of this invention is to provide a new method of coating Nb-Ti and Nb-Zr alloy wires with aluminum without forming reaction products between the aluminum and alloy wires.

These and other objects of this invention are accomplished by providing
a process in which A. a Nb-Ti or Nb-Zr low temperature superconductor wire is coated in molten $AgNO_3$ at a temperature above the melting point of $AgNO_3$ (212° C.) but below the decomposition temperature of $AgNO_3$;

B. heating the molten $AgNO_3$ coated wire at a temperature of from above the decomposition temperature of $AgNO_3$ to about 700° C. to decompose the $AgNO_3$ and form a uniform coating of silver metal on the Nb-Ti or Nb-Zr wire;

Step A and B may be repeated to increase the thickness of the silver metal coating;

C. forming a uniform coating of aluminum or an aluminum alloy, on the silver metal coated Nb-Ti or Nb-Zr wire;

D. inserting a bundle of the aluminum or aluminum alloy coated wires produced in step C into an aluminum or aluminum alloy tube; and E. Cold swaging the aluminum or aluminum alloy tube and wires inside to reduce the diameter and form a multilamentary low-temperature superconductor cable comprising silver metal coated Nb-Ti or Nb-Zr low temperature superconductor alloy wires in an aluminum or aluminum alloy matrix.

DETAILED DESCRIPTION OF THE EMBODIMENT

The invention provides a method of fabricating new multifilamentary low temperature superconductor (LTS) cables. These cable contain strands of niobium-titanium (Nb-Ti) or niobium-zirconium (Nb-Zr) low temperature superconductor (LTS) alloy wire for transport of the superconducting current. Each strand is coated with silver metal and is surrounded by pure aluminum or aluminum alloy to enhance the thermal stability and rapid heat transfer in case of a quench. The surface interface between the Nb-Ti or Nb-Zr LTS alloy wire and the silver metal coating is free of reaction products. Similarly, the surface interface between the silver metal coating and the aluminum or aluminum alloy matrix is free of reaction products and free of aluminum oxide. This is important because reaction products and aluminum oxide would cause poor thermal and electrical characteristics in the cable.

In the first phase of the process, the filaments or strands of the Nb-Ti or Nb-Zr low temperature superconductor alloy wire is coated with a thin (e.g., on the order of 5 to 20 microns thick) silver metal layer. The Nb-Ti or Nb-Zr wire is first coated with molten $AgNO_3$. This can be done by simply dipping or passing the wire through molten $AgNO_3$. The molten $AgNO_3$ has excellent wetting properties and rapidly spreads to form a uniform coating over the entire wire. This molten $AgNO_3$ coating step is run at a temperature from above the melting point of $AgNO_3$ (212° C.) to below the decomposition temperature of $AgNO_3$ (444° C.). The molten $AgNO_3$ coating protects the Nb-Ti or Nb-Zr wire against oxidation in the air. Next the molten $AgNO_3$ coated wire is heated to a temperature of preferably from above the decomposition temperature of $AgNO_3$ to about 700° C., more preferably from 450° C. to 550° C., and still more preferably from 450° C. to 500° C. to decompose the molten $AgNO_3$ and form a uniform coating of solid silver metal on the surface of the Nb-Ti or Nb-Zr superconductor alloy. The $AgNO_3$ and silver metal do not react with the Nb-Ti or the Nb-Zr wire. Moreover, both the molten Ag and the silver metal coatings protect the Nb-Ti or the Nb-Zr wire against oxidation in air. If a thicker silver metal layer is desired, the molten $AgNO_3$ coating and decomposition steps are repeated until a silver metal layer of the desired thickness has been obtained.

In the next phase of the process, the silver metal coated Nb-Ti or Nb-Zr wire is coated with aluminum. This may be done by vertically dipping the wires in molten aluminum as was done in the examples. However, it is preferable to use conventional continuous process techniques for applying a coating of a molten metal or alloy on a wire by passing the wire through a bath of the molten metal. In the present case, the Nb-Ti or Nb-Zr low temperature superconductor wire may be unwound from a spool passed through a bath of molten aluminum or aluminum alloy, the aluminum or aluminum alloy allowed to solidify, and the solid aluminum coated wire taken up on a second spool. There are two conditions which limit the way in which the convention coating process is run. First the wire should pass through the bath smoothly so that a uniform coating of aluminum or aluminum alloy is formed on the wire. This presents no problem as the conventional processes are generally designed to produce uniform coatings. The second condition is that the amount of time that the silver metal coated Nb-Ti or Nb-Zr wire is in the molten aluminum alloy must be limited. If the wire is left in the molten aluminum too long, the silver metal coating will be dissolved off and the molten aluminum will chemically attack the Nb-Ti or Nb-Zr alloy wire. An examination of the product aluminum coated Nb-Ti or Nb-Zr alloy wire will then reveal reaction products. The amount of time the wire spends in the molten aluminum alloy bath can be reduced by shortening the path of the wire through the bath or by increasing the speed of the wire. Another approach is to increase the thickness of the silver metal coating on the Nb-Ti or Nb-Zr alloy wires and thereby increase time that the wire can be in the molten aluminum or aluminum alloy bath.

A multifilamentary low temperature superconductor (LTS) cable is then produced by inserting a bundle of the aluminum or aluminum coated (plus silver metal coated) Nb-Ti or Nb-Zr low temperature superconductor alloy wires into an aluminum or aluminum alloy tube and then cold swaging the aluminum tube to consolidate and reduce the diameter of the cable. As illustrated by the examples, after some initial cold swaging, the aluminum tube (with wires inside) is placed into a steel tube and the swaging is completed with the steel tube. After the swaging is done, the steel tube is removed. This may be done by abrading away as shown in Example 3.

Normally, for example, several hundred strands of the coated 10 mil superconductor wire are bundled together in the tube. Swaging progresses until the strand diameter reaches about 10 microns. This corresponds to about an 1800X areal reduction. The ratio of superconductor to aluminum cross section is optimized from thermal conduction modeling and experience and will vary depending upon application. A smaller superconductor wire to Al ratio will produce a more thermally stable wire at the cost of a reduced $J_c$. Consideration of operation in self and applied magnetic fields, thermal environment and forces depend upon intended application.

The general nature of the invention having been set forth, the following examples are presented as specific illustrations thereof. It will be understood that the invention is not limited to these specific examples but is susceptible to various modifications that will be recognized by one of ordinary skill in the art.

EXAMPLE 1

An appropriate quantity of $AgNO_3$ was put in a quartz tube (closed end). The tube was placed in a coffee pot furnace and heated above the $AgNO_3$ melting temperature ($\sim 225°$ C.) to produce a molten $AgNO_3$ bath. Strands of 0.0079 inch diameter Nb-Ti low temperature superconductor (LTS) wire were dipped into the molten $AgNO_3$ bath and withdrawn. Because of the excellent wetting properties of molten $AgNO_3$, a uniform coating of molten $AgNO_3$ was produced on the strands. The molten $AgNO_3$ coated Nb-Ti strands were then transferred to a furnace at a temperature above the decomposition temperature of $AgNO_3$. The molten $AgNO_3$ decomposed to produce a thin uniform layer of pure silver metal on the Nb-Ti strands.

Subsequently, pure molten aluminum was provided in another open topped vertical furnace. The silver metal coated strands of Nb-Ti were quickly dipped into the aluminum. Some difficulty was experienced in the molten aluminum dipping. Flexibility of the strands caused some bending as they were dipped into the molten aluminum due to the surface tension of the molten aluminum. This, in turn, caused a nonuniform flashing on the aluminum coating. A continuous dipping process would solve this relatively minor problem.

Next, 18 of the coated strands about 6 inches in length were chosen. These were inserted as a bundle into a small aluminum tube with an inner diameter of 0.190 inches. This was swaged through several dies and inserted into an 0.250 inch steel tube. This was further swaged through dies to an outer diameter of 0.125 inches. A cross section of the final cable was studied. Significant sausaging was evident due to uneven dipping (too thick of an aluminum coating on some wires). Several strand cross sections were much reduced or not observable The distortion of individual filament cross sections from their original round geometry, however, is common to all multifilamentary cable approaches with extensive swaging The important point is to maintain consistent and separated cross sections among the filaments down to the required filament diameter.

EXAMPLE

A second attempt was made using 0.015 inch diameter Nb-Ti wire strands which were coated twice with silver metal using the molten $AgNO_3$ method of example 1. The silver metal coated Nb-Ti wire strands were quick dipped into pure molten aluminum at 705° C. After dipping, the aluminum coated strand diameters measured 0.018–0.022 inches. Nine such strands were inserted into an aluminum tube with a 0.375 inch diameter. This was swaged and inserted into a 0.275 inch inner diameter steel tube. The sample was swaged further through 14 dies to reduce the outer diameter of the aluminum tube from 0.243 inches to 0.082 inches. Some sausaging was noted, apparently due primarily to nonuniformity of the aluminum coating.

EXAMPLE 3

A third attempt was made with an improved aluminum dipping arrangement. An insulated concentric heater was placed around the ceramic vessel containing pure aluminum ingot. This assembly was placed on a table having a heat resisting surface. The temperature of the aluminum filled vessel was elevated to and maintained at about 650° C. The virtue of this heating arrangement is its unobstructed vertical access. This allowed the silver metal coated Nb-Ti superconductor wire to be dipped vertically into the molten aluminum, permitting a more even coating of aluminum to be deposited on the strands. Ultimately, however, an automated dipping device must be developed to take full advantage of this methodology.

Next, 29 aluminum coated strands (approx. 6 inches long) were inserted into an Al tube as in the previous case. The tube was swaged from its initial I.D. 0.305 inches to 0.281 inches and inserted into a steel tube as in Example 2. The sample was swaged subsequently through some 23 dies with portions cut at intermediate stages for evaluation.

The outside wire diameter was reduced to 0.076 inches. At this degree of swaging, the individual strands of Nb-Ti were discernible, though highly distorted in shape. The outer steel sheath was removed by abrading and the inner aluminum tube was dissolved in NaOH, revealing the Nb-Ti wire strands. These were observed to be continuous over several inches. Their highly irregular shapes could be improved by refinement of the Al dipping procedure. Continuous hot dipping in the molten Al to obtain a very uniform coating followed by careful, straight layup of the strands in the Al tube should produce more uniform results.

Numerous other modifications and variations of the present invention are possible in light of the foregoing teachings. It is therefore to be understood that within the scope of the appended claims the invention may be practiced otherwise than as specifically described.

What is claimed is:

1. A method of producing a multifilamentary low temperature superconductor cable comprising the following steps in order:
    A. selecting a low temperature superconductor alloy wire selected from the group consisting of low temperature niobium-titanium alloy wires and low temperature niobium-zircondium alloy wires;
    B. coating the superconductor alloy wire with molten $AgNO_3$ at a temperature from above the melting point of $AgNO_3$ to below the decomposition temperature of $AgNO_3$;
    C. heating the molten $AgNO_3$ coated superconductor alloy wire produced in step B at a temperature from above the decomposition temperature of $AgNO_3$ to about 700° C. until the molten $AgNO_3$ decomposes and forms a uniform layer of silver metal covering the surface of the superconductor alloy wire;
    D. repeating steps B and C until a silver metal coating of a desired thickness is formed on the superconductor alloy wire:
    E. forming a uniform coating of an aluminum material selected from the group consisting of aluminum and aluminum alloys on the silver metal coated superconductor alloy wire produced by steps B through D by melting the aluminum material and then passing the silver metal coated superconductor alloy wire through the molten aluminum material;
    F. allowing the uniform coating of the aluminum material to cool and solidify on the silver metal coated superconductor wire;
    G. inserting a bundle of coated superconductor alloy wires produced according to steps A through F into a tube made of the aluminum material selected in step E; and
    H. cold working the aluminum material tube and the wire bundle, thereby reducing the diameter of the tube and consolidating the tube and wire bundle, this forming a multifilamentary low temperature superconductor cable which comprises silver metal coated low temperature superconductor alloy wires in a matrix of the aluminum material wherein the matrix separates each wire from each of the other wires and from the outside of the cable.

2. The method of claim 1 wherein the low temperature superconductor alloy wire selected in step A is a low temperature superconductor niobium-titanium alloy wire.

3. The method of claim 1 wherein the low temperature superconductor alloy wire selected in step A is a low temperature superconductor niobium-zirconium alloy wire.

4. The method of claim 1 wherein a uniform coating of aluminum is formed on the wire in step E.

5. The method of claim 1 wherein a uniform coating of an aluminum alloy is formed on the wire in step E.

6. The method of claim 1 wherein an aluminum tube is used in steps G and H.

7. The method of claim 1 wherein an aluminum alloy tube is used in steps G and H.

8. The method of claim 1 wherein the cold working in step H in cold swaging.

9. The method of claim 1 wherein the molten $AgNO_3$ is decomposed in step C at a temperature of from 450° C. to 550° C.

10. The method of claim 9 wherein the molten $AgNO_3$ is decomposed in step C at a temperature of from 450° C. to 500° C.

11. A method of producing a composite wire comprising:
    A. selecting a low temperature superconductor alloy wire selected from the group consisting of low temperature niobium-titanium alloy wires and low temperature niobium-zircondium alloy wires;
    B. coating the superconductor alloy wire with molten $AgNO_3$ at a temperature from above the melting point of $AgNO_3$ to below the decomposition temperature of $AgNO_3$;
    C. heating the molten $AgNO_3$ coated superconductor alloy wire produced in step B at a temperature from above the decomposition temperature of $AgNO_3$ to about 700° C. until the molten $AgNO_3$ decomposes and forms a uniform layer of silver metal covering the surface of the superconductor alloy wire;
    D. repeating steps B and C until a silver metal coating of a desired thickness is formed on the superconductor alloy wire;
    E. forming a uniform coating of an aluminum material selecting from the group consisting of aluminum and aluminum alloys on the silver metal coated superconductor alloy wire produced by steps B through D by melting the aluminum material and then passing the silver metal coated superconductor alloy wire through the molten aluminum material; and
    F. allowing the uniform coating of the aluminum material to cool and solidify on the silver metal coated superconductor wire.

12. The method of claim 11 wherein the low temperature superconductor alloy wire selected in step A is a low temperature superconductor niobium-titanium alloy wire.

13. The method of claim 11 wherein the low temperature superconductor alloy wire selected in step A is a low temperature superconductor niobium-zirconium alloy wire.

14. The method of claim 11 wherein a uniform coating of aluminum is formed on the wire in step E.

15. The method of claim 11 wherein a uniform coating of an aluminum alloy is formed on the wire in step E.

16. The method of claim 11 wherein the molten $AgNO_3$ is decomposed in step C at a temperature of from 450° C. to 550° C.

17. The method of claim 16 wherein the molten $AgNO_3$ is decomposed in step C at a temperature of from 450° C. to 500° C.

* * * * *